(12) United States Patent
Lee

(10) Patent No.: US 9,940,871 B2
(45) Date of Patent: Apr. 10, 2018

(54) METHOD OF SENSING DEGRADATION OF PIXEL AND ORGANIC LIGHT EMITTING DIODE DISPLAY DEVICE

(71) Applicant: SAMSUNG DISPLAY CO., LTD., Yongin-si, Gyeonggi-do (KR)

(72) Inventor: Dong-Won Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 198 days.

(21) Appl. No.: 15/077,295

(22) Filed: Mar. 22, 2016

(65) Prior Publication Data

US 2017/0067957 A1    Mar. 9, 2017

(30) Foreign Application Priority Data

Sep. 8, 2015 (KR) ........................ 10-2015-0126896

(51) Int. Cl.
*G09G 3/3208* (2016.01)
*H05B 33/08* (2006.01)
*G01R 31/26* (2014.01)
*G09G 3/00* (2006.01)

(52) U.S. Cl.
CPC ....... *G09G 3/3208* (2013.01); *G01R 31/2635* (2013.01); *G09G 3/006* (2013.01); *H05B 33/0851* (2013.01); *H05B 33/0896* (2013.01); *G09G 2320/045* (2013.01); *Y02B 20/36* (2013.01)

(58) Field of Classification Search
CPC ....... G09G 2320/043; G09G 2320/045; G09G 3/3208–3/3291
See application file for complete search history.

(56) References Cited

U.S. PATENT DOCUMENTS

| | | | | |
|---|---|---|---|---|
| 9,349,317 | B2* | 5/2016 | Kim ...................... | G09G 3/3233 |
| 9,805,646 | B2* | 10/2017 | Park ...................... | G09G 3/3225 |
| 2006/0238943 | A1* | 10/2006 | Awakura .............. | G09G 3/3258 361/93.1 |
| 2014/0176409 | A1* | 6/2014 | Kim ...................... | G09G 3/3233 345/92 |
| 2015/0243216 | A1* | 8/2015 | Chung ................. | G09G 3/3233 345/214 |
| 2015/0243217 | A1* | 8/2015 | Park ...................... | G09G 3/3258 345/76 |
| 2016/0133172 | A1* | 5/2016 | Hwang ................ | G09G 3/3233 324/762.07 |

(Continued)

FOREIGN PATENT DOCUMENTS

KR    10-2014-0083184 A    7/2014

*Primary Examiner* — Patrick F Marinelli
(74) *Attorney, Agent, or Firm* — Lewis Roca Rothgerber Christie LLP

(57) ABSTRACT

In a method of sensing degradation of pixels in an organic light emitting diode (OLED) display device, the method includes: generating degradation sensing data for the pixels by sensing the degradation of the pixels; generating degradation estimation data for the pixels based on input image data for the pixels; setting a degradation baseline for each sensing channel based on the degradation estimation data; and determining degrees of degradation of the pixels based on a difference between the degradation sensing data and the degradation baseline.

20 Claims, 8 Drawing Sheets

(56) References Cited

U.S. PATENT DOCUMENTS

| | | | |
|---|---|---|---|
| 2016/0133193 A1* | 5/2016 | Lee | G09G 3/3275 |
| | | | 345/694 |
| 2016/0148561 A1* | 5/2016 | Park | G09G 3/3225 |
| | | | 345/690 |
| 2016/0189618 A1* | 6/2016 | Park | G09G 3/3233 |
| | | | 345/690 |
| 2016/0343302 A1* | 11/2016 | Han | G09G 3/3233 |
| 2017/0067957 A1* | 3/2017 | Lee | G01R 31/2635 |
| 2017/0193881 A1* | 7/2017 | Kim | G09G 3/2074 |

* cited by examiner

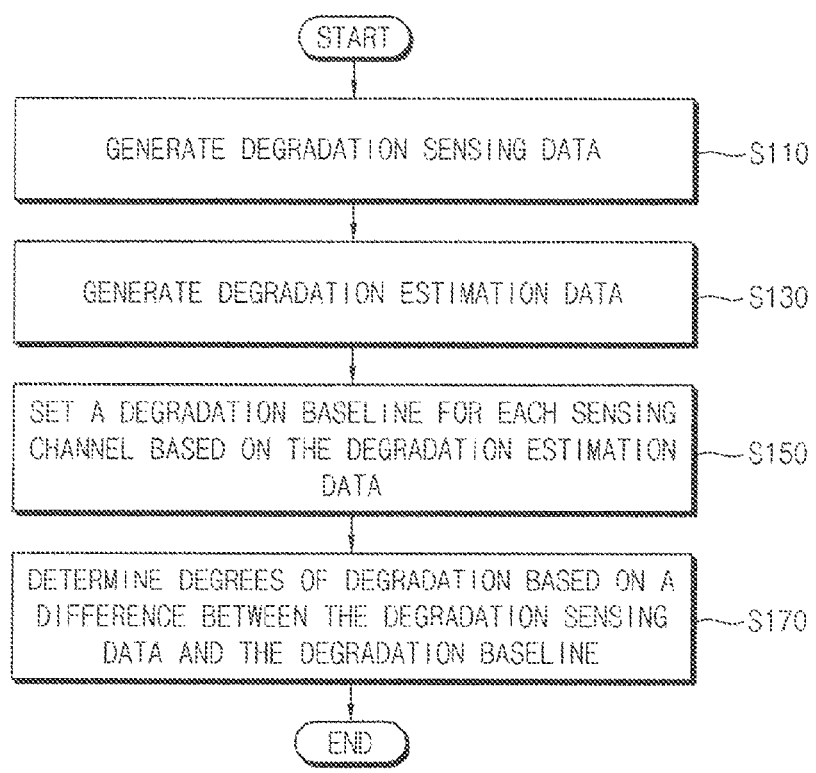

METHOD OF SENSING DEGRADATION OF PIXEL AND ORGANIC LIGHT EMITTING DIODE DISPLAY DEVICE

CROSS-REFERENCE TO RELATED APPLICATION

This application claims priority to and the benefit of Korean Patent Application No. 10-2015-0126896, filed on Sep. 8, 2015 in the Korean Intellectual Property Office (KIPO), the content of which is incorporated herein in its entirety by reference.

BACKGROUND

1. Field

Aspects of one or more example embodiments of the present invention relate generally to methods of sensing degradation of pixels in organic light emitting diode (OLED) display devices and the OLED display devices.

2. Description of the Related Art

In an organic light-emitting diode (OLED) display device, an OLED in each pixel tends to degrade over time, which may generally cause pixel luminance to decrease. To compensate for this luminance degradation, a sensing integrated circuit (IC) may be incorporated into an OLED display device to measure current flowing through one or more OLEDs by applying a voltage (e.g., a predetermined voltage) to the OLEDs.

However, a related art sensing IC may have an offset (or deviation) with respect to an adjacent sensing IC. Further, there may be an offset (or deviation) between sensing channels in the same sensing IC. Thus, a significant amount of time and expense may be required to compensate the offset between the sensing ICs or the sensing channels.

The above information disclosed in this Background section is only to enhance the understanding of the background of the invention, and therefore it may contain information that does not constitute prior art.

SUMMARY

According to some example embodiments of the present invention, a method of sensing degradation of pixels may be capable of accurately sensing the degradation of the pixels without performing offset compensation.

According to some example embodiments of the present invention, an organic light emitting diode display device may be capable of accurately sensing the degradation of the pixels without performing offset compensation.

According to some example embodiments, in a method of sensing degradation of pixels in an organic light emitting diode (OLED) display device, the method includes: generating degradation sensing data for the pixels by sensing the degradation of the pixels; generating degradation estimation data for the pixels based on input image data for the pixels; setting a degradation baseline for each sensing channel based on the degradation estimation data; and determining degrees of degradation of the pixels based on a difference between the degradation sensing data and the degradation baseline.

According to some example embodiments, setting the degradation baseline for each sensing channel includes: dividing the pixels corresponding to the sensing channel into pixels in a non-degraded region and pixels in a degraded region based on the degradation estimation data for the pixels corresponding to the sensing channel; setting the degradation baseline for the non-degraded region of the sensing channel based on the degradation sensing data for the pixels in the non-degraded region; and setting the degradation baseline for the degraded region of the sensing channel by interpolating the degradation sensing data for at least two of the pixels in the non-degraded region adjacent to the degraded region.

According to some example embodiments, dividing the pixels corresponding to the sensing channel into the pixels in the non-degraded region and the pixels in the degraded region includes: identifying a first group from among the pixels having the degradation estimation data less than or equal to a threshold value as being in the non-degraded region; and identifying a second group from among the pixels having the degradation estimation data greater than the threshold value as being in the degraded region.

According to some example embodiments, setting the degradation baseline for the degraded region of the sensing channel includes: setting the degradation baseline for the degraded region of the sensing channel by linearly interpolating the degradation sensing data for a first one of the pixels in the non-degraded region adjacent to a start point of the degraded region and the degradation sensing data for a second one of the pixels in the non-degraded region adjacent to an end point of the degraded region.

According to some example embodiments, generating the degradation sensing data for the pixels includes: measuring sensing currents flowing through OLEDs in the pixels; and generating the degradation sensing data for the pixels based on the sensing currents.

According to some example embodiments, generating the degradation estimation data for the pixels includes: accumulating the input image data for the pixels; and generating the degradation estimation data for the pixels based on the accumulated input image data.

According to some example embodiments, the method further includes compensating the degradation of the pixels based on the degrees of degradation of the pixels.

According to some embodiments of the present invention, in a method of sensing degradation of pixels in an organic light emitting diode (OLED) display device, the method includes: generating degradation sensing data for the pixels by sensing the degradation of the pixels; generating degradation estimation data for the pixels based on input image data for the pixels; sequentially comparing the degradation estimation data for the pixels corresponding to each sensing channel with a threshold value; setting a position at which a value of the degradation estimation data is changed from less than or equal to the threshold value to greater than the threshold value as a start point of a degraded region of the sensing channel; setting a position at which the value of the degradation estimation data is changed from greater than the threshold value to less than or equal to the threshold value as an end point of the degraded region of the sensing channel; setting a degradation baseline for the degraded region by interpolating the degradation sensing data for at least two of the pixels in a non-degraded region adjacent to the degraded region; and determining degrees of degradation of the pixels in the degraded region based on a difference between the degradation sensing data for the pixels in the degraded region and the degradation baseline for the degraded region.

According to some example embodiments, setting the degradation baseline for the degraded region includes: setting the degradation baseline for the degraded region by linearly interpolating the degradation sensing data for a first one of the pixels in the non-degraded region adjacent to the start point of the degraded region and the degradation sensing data for a second one of the pixels in the non-degraded region adjacent to the end point of the degraded region.

According to some example embodiments, the pixels in the non-degraded region are determined to be not degraded.

According to some example embodiments of the present invention, an organic light emitting diode (OLED) display device includes: a plurality of pixels comprising a plurality of OLEDs, respectively; a sensing data generator configured to generate degradation sensing data for the pixels by sensing the degradation of the pixels; an estimation data generator configured to generate degradation estimation data for the pixels based on input image data for the pixels; and a degradation determiner configured to receive the degradation sensing data from the sensing data generator, to receive the degradation estimation data from the estimation data generator, to set a degradation baseline for each sensing channel based on the degradation estimation data, and to determine degrees of degradation of the pixels based on a difference between the degradation sensing data and the degradation baseline.

According to some example embodiments, the degradation determiner is configured to divide the pixels corresponding to the sensing channel into pixels in a non-degraded region and pixels in a degraded region based on the degradation estimation data for the pixels corresponding to the sensing channel, set the degradation baseline for the non-degraded region of the sensing channel based on the degradation sensing data for the pixels in the non-degraded region, and set the degradation baseline for the degraded region of the sensing channel by interpolating the degradation sensing data for at least two of the pixels in the non-degraded region adjacent to the degraded region.

According to some example embodiments, the degradation determiner is configured to identify a first group from among the pixels having the degradation estimation data less than or equal to a threshold value as being in the non-degraded region, and to identify a second group from among the pixels having the degradation estimation data greater than the threshold value as being in the degraded region.

According to some example embodiments, the degradation determiner is configured to set the degradation baseline for the degraded region of the sensing channel by linearly interpolating the degradation sensing data for a first one of the pixels in the non-degraded region adjacent to a start point of the degraded region and the degradation sensing data for a second one of the pixels in the non-degraded region adjacent to an end point of the degraded region.

According to some example embodiments, the degradation determiner is configured to sequentially compare the degradation estimation data for the pixels corresponding to each sensing channel with a threshold value, set a position at which a value of the degradation estimation data is changed from less than or equal to the threshold value to greater than the threshold value as a start point of a degraded region of the sensing channel, set a position at which the value of the degradation estimation data is changed from greater than the threshold value to less than or equal to the threshold value as an end point of the degraded region of the sensing channel, set a degradation baseline for the degraded region by interpolating the degradation sensing data for at least two of the pixels in a non-degraded region adjacent to the degraded region, and determine the degrees of degradation of the pixels in the degraded region based on a difference between the degradation sensing data for the pixels in the degraded region and the degradation baseline for the degraded region.

According to some example embodiments, the sensing data generator is configured to measure sensing currents flowing through the OLEDs included in the pixels, and generate the degradation sensing data for the pixels based on the sensing currents.

According to some example embodiments, the sensing data generator includes: an integrator configured to integrate the sensing currents flowing through the OLEDs of the pixels corresponding to the sensing channel; and an analog-to-digital converter configured to generate the degradation sensing data based on an output voltage of the integrator.

According to some example embodiments, the estimation data generator is configured to accumulate the input image data for the pixels, and to generate the degradation estimation data for the pixels based on the accumulated input image data.

According to some example embodiments, the OLED display device further includes a data converter configured to convert the input image data into compensated image data to compensate the degradation of the pixels based on the degrees of degradation of the pixels.

According to some example embodiments, the OLED display device further includes a data driver configured to adjust data voltages applied to the pixels to compensate the degradation of the pixels based on the degrees of degradation of the pixels.

As described above, the method of sensing the degradation of the pixels and the OLED display device according to example embodiments may set the degradation baseline for each sensing channel, and may determine the degrees of degradation of the pixels based on the difference between the degradation sensing data and the degradation baseline. Accordingly, in the method of sensing the degradation of the pixels and the OLED display device according to example embodiments, the degrees of degradation may be accurately measured without performing offset compensation between sensing channels or between sensing ICs.

BRIEF DESCRIPTION OF THE DRAWINGS

Illustrative, non-limiting example embodiments will be more clearly understood from the following detailed description taken in conjunction with the accompanying drawings.

FIG. 1 is a flowchart illustrating a method of sensing degradation of pixels in an organic light emitting diode (OLED) display device according to some example embodiments of the present invention.

DETAILED DESCRIPTION

Figure 2A:
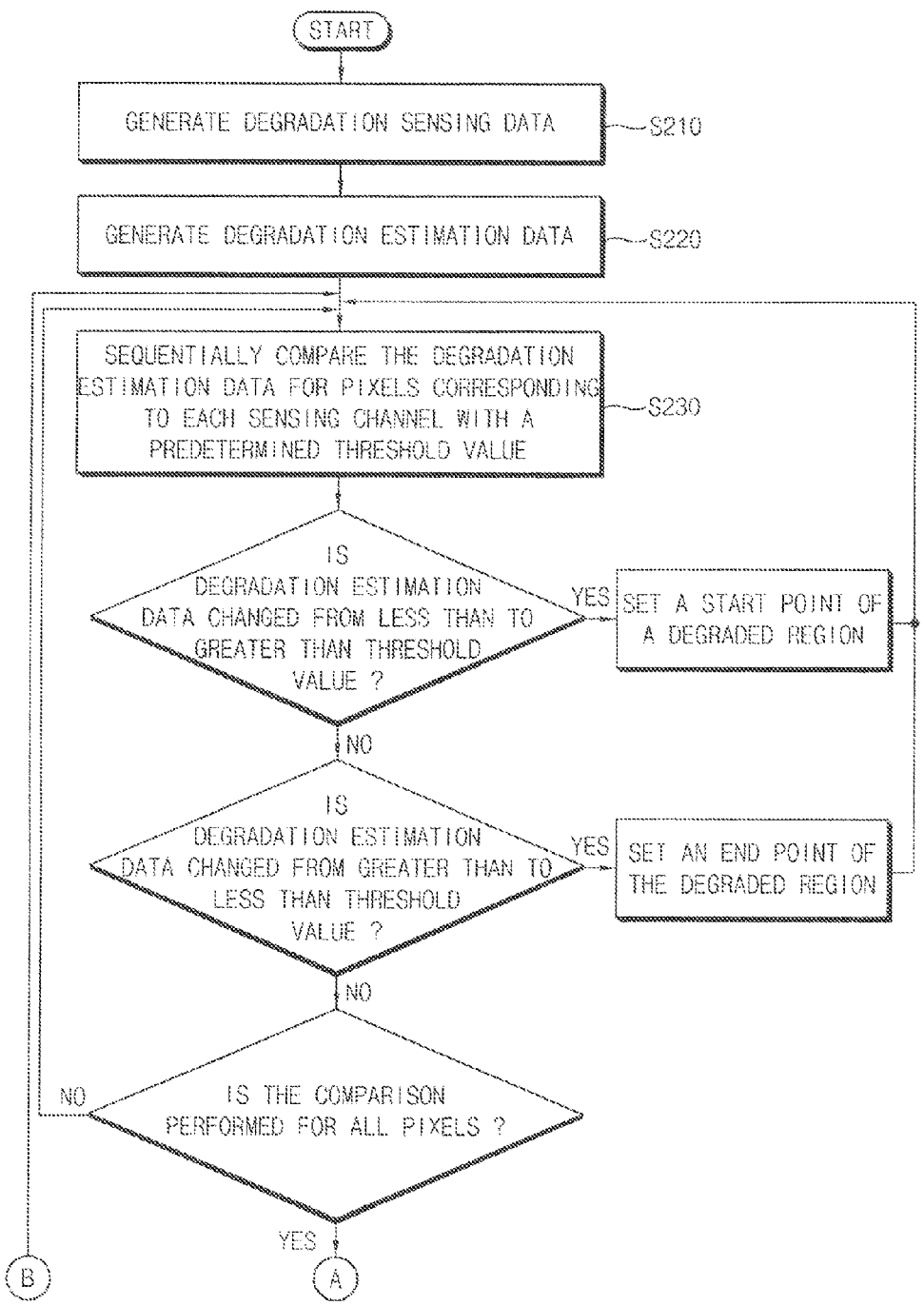
FIGS. 2A and 2B are a flowchart illustrating a method of sensing degradation of pixels in an OLED display device according to some example embodiments of the present invention.

The example embodiments are described more fully hereinafter with reference to the accompanying drawings. Like or similar reference numerals refer to like or similar elements throughout.

The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a flowchart illustrating a method of sensing degradation of pixels in an organic light emitting diode (OLED) display device according to some example embodiments of the present invention.

Referring to FIG. 1, in a method of sensing degradation of pixels in an OLED display device, degradation sensing data for the pixels are generated by sensing the degradation of the pixels (S110). According to example embodiments, degradation of an OLED included in each pixel and/or degradation of a thin film transistor (TFT) included in each pixel may be sensed. In some example embodiments, a sensing voltage may be applied to the OLEDs included in the pixels, sensing currents flowing through the OLEDs by the sensing voltage may be measured, and the degradation sensing data may be generated based on the sensing currents.

Degradation estimation data for the pixels are generated based on input image data for the pixels (S130). In some example embodiments, the input image data for the pixels may be accumulated, and the degradation estimation data may be generated based on the accumulated input image data.

A degradation baseline for each sensing channel is set based on the degradation estimation data (S150). That is, independent degradation baselines may be set with respect to respective sensing channels. Here, one sensing channel may represent degradation sensing data obtained from pixels connected to the same sensing line, or may represent a sensing path including the sensing line. In some example embodiments, the pixels corresponding to each sensing channel may be divided into pixels in a non-degraded region and pixels in a degraded region based on the degradation estimation data for the pixels corresponding to the sensing channel. For example, the pixels having the degradation estimation data less than or equal to a threshold value (e.g., a predetermined threshold value) may be determined as the pixels in the non-degraded region, and the pixels having the degradation estimation data greater than the threshold value (e.g., the predetermined threshold value) may be determined as the pixels in the degraded region.

The degradation baseline for the non-degraded region of the sensing channel may be set based on the degradation sensing data for the pixels in the non-degraded region. For example, the pixels in the non-degraded region may be determined to be not degraded, and the degradation sensing data for the pixels in the non-degraded region may be determined as the degradation baseline for the non-degraded region.

Further, the degradation baseline for the degraded region of the sensing channel may be set by interpolating the degradation sensing data for at least two of the pixels in the non-degraded region adjacent to the degraded region. For example, the degradation baseline for the degraded region of the sensing channel may be set by linearly interpolating the degradation sensing data for a first one of the pixels in the non-degraded region adjacent to a start point of the degraded region and the degradation sensing data for a second one of the pixels in the non-degraded region adjacent to an end point of the degraded region.

Degrees of degradation of the pixels may be determined based on a difference between the degradation sensing data and the degradation baseline (S170). For example, as for the pixels in the non-degraded region, the degradation sensing data and the degradation baseline may have the same value (or substantially the same value), and thus the degrees of degradation may be 0 (or about 0), which indicates or represents that the pixels in the non-degraded region are not degraded. As for the pixels in the degraded region, the degrees of degradation may be calculated by subtracting a value of the degradation baseline from a value of the degradation sensing data.

The degradation of the pixels may be compensated based on the determined degrees of degradation of the pixels. In some example embodiments, the input image data may be converted into compensated image data to compensate the degradation of the pixels based on the determined degrees of degradation of the pixels. In other example embodiments, data voltages (or gamma voltages) applied to the pixels may be adjusted to compensate the degradation of the pixels based on the determined degrees of degradation of the pixels.

Due to a characteristic variation of a sensing circuit or a characteristic variation of a sensing channel, a sensing offset may exist between sensing integrated circuits (ICs) or between sensing channels in the same sensing IC. Thus, in a related art OLED display device, sensing offset compensation between the sensing ICs or between the sensing channels may be performed for accurate degradation compensation. However, in the OLED display device according to example embodiments, the degradation baseline may be set for each sensing channel, and the degrees of deterioration of the pixels may be determined based on the difference between the degradation sensing data and the degradation baseline. Accordingly, in the OLED display device according to example embodiments, the degrees of deterioration of the pixels may be accurately measured without performing the sensing offset compensation between the sensing ICs or the sensing channels.

Figure 2B:
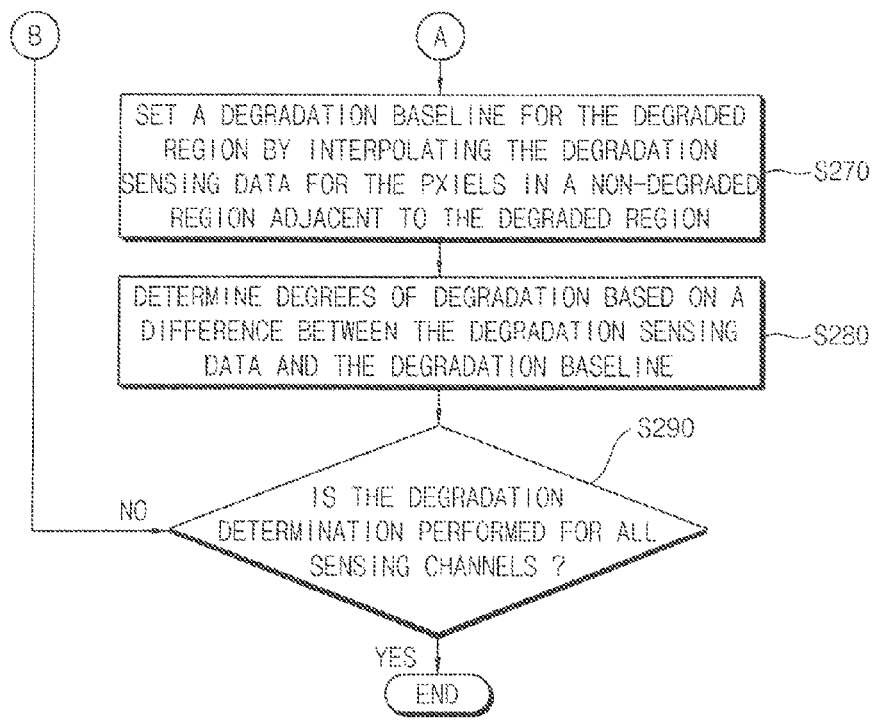
Figure 3:
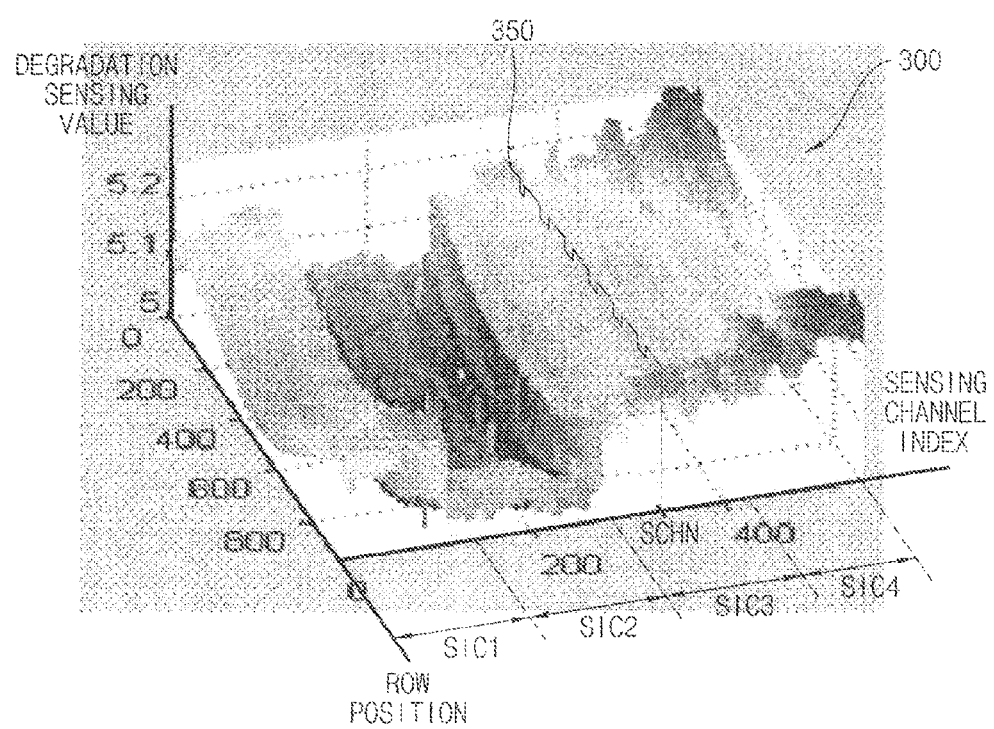
FIG. 3 is a diagram illustrating an example of a degradation sensing data distribution according to some example embodiments of the present invention.
Figure 4:
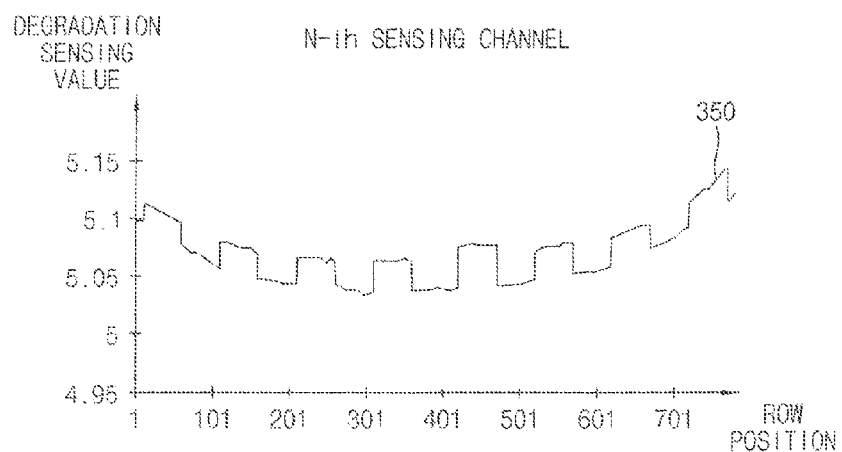
FIG. 4 is a diagram illustrating an example of degradation sensing data for an N-th sensing channel according to some example embodiments of the present invention.
Figure 5:
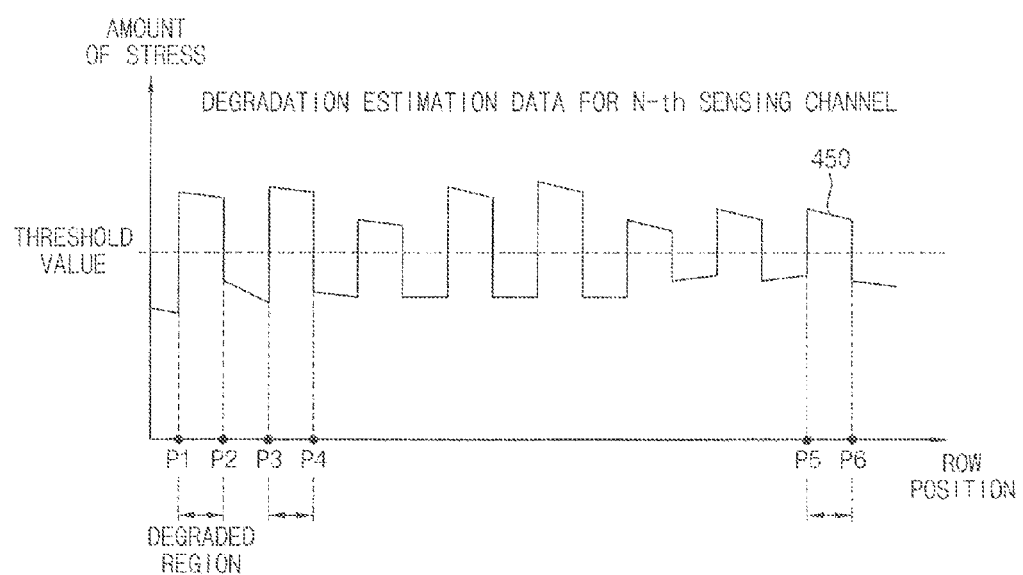
FIG. 5 is a diagram illustrating an example of degradation estimation data for an N-th sensing channel according to some example embodiments of the present invention.
Figure 6:
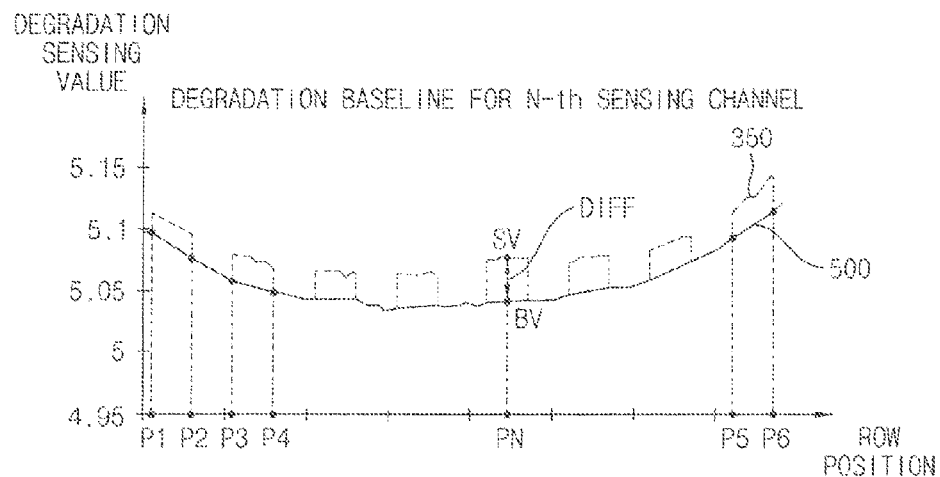
FIG. 6 is a diagram illustrating an example of a degradation baseline for an N-th sensing channel according to some example embodiments of the present invention.
Figure 7:
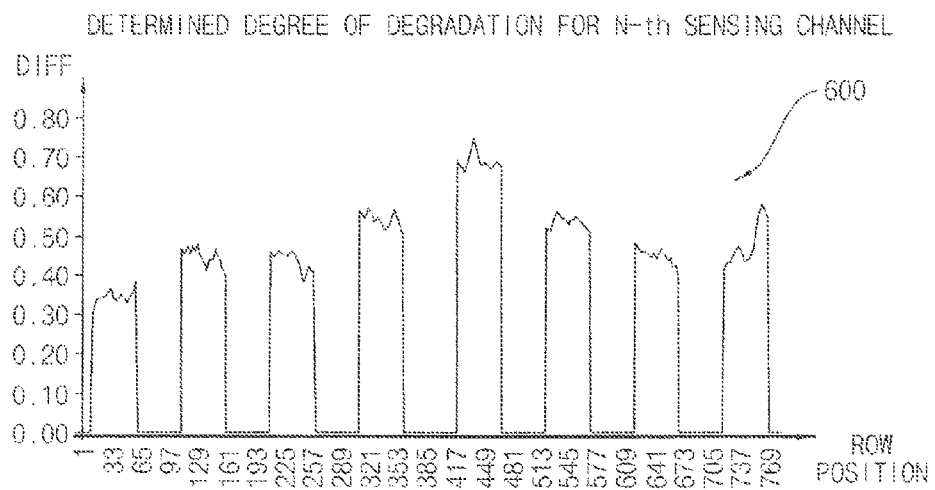
FIG. 7 is a diagram illustrating degrees of degradation of pixels corresponding to an N-th sensing channel according to some example embodiments of the present invention.

FIGS. 2A and 2B are a flowchart illustrating a method of sensing degradation of pixels in an OLED display device according to example embodiments, FIG. 3 is a diagram illustrating an example of a degradation sensing data distribution, FIG. 4 is a diagram illustrating an example of degradation sensing data for an N-th sensing channel, FIG. 5 is a diagram illustrating an example of degradation estimation data for an N-th sensing channel, FIG. 6 is a diagram illustrating an example of a degradation baseline for an N-th sensing channel, and FIG. 7 is a diagram illustrating degrees of degradation of pixels corresponding to an N-th sensing channel.

Referring to FIGS. 2A and 2B, in a method of sensing degradation of pixels in an OLED display device, degradation sensing data for the pixels may be generated by sensing the degradation of the pixels (S210). For example, the degradation sensing data 300 may be generated as illustrated in FIG. 3. In FIG. 3, an X-axis may represent a sensing channel index, a Y-axis may represents a row position indicating which row each pixel is located at, and a Z-axis may represent a value of the degradation sensing data. In the example of FIG. 3, the degradation sensing data 300 obtained by a second sensing IC SIC2 may be relatively lower than the degradation sensing data 300 obtained by the other first, third and fourth sensing ICs SIC1, SIC3 and SIC4, which may be caused not by different degrees of degradation between the pixels connected to the sensing ICs SIC1, SIC2, SIC3 and SIC4, but by a sensing offset between the sensing ICs SIC1, SIC2, SIC3 and SIC4. Further, there may be a sensing offset between sensing channels in the same sensing IC as well as between the sensing ICs SIC1, SIC2, SIC3 and SIC4. FIG. 4 illustrates the degradation sensing data 350 of an N-th sensing channel, where N may be any integer greater than 0. In FIG. 4, an X-axis represents the row position, and a Y-axis represents the value of the degradation sensing data.

Degradation estimation data for the pixels may be generated based on input image data for the pixels (S220). In some example embodiments, the input image data for the pixels may be accumulated, and the degradation estimation data may be generated based on the accumulated input image data.

To set a degradation baseline for each sensing channel based on the degradation estimation data, the degradation estimation data for the pixels corresponding to each sensing channel may be sequentially compared with a predetermined threshold value (S230). For example, the degradation estimation data for the pixels corresponding to the sensing channel may be sequentially compared with the threshold value (e.g., the predetermined threshold value) in the order from a pixel located at the first row (or a pixel having a row position of 1) to a pixel located at the last row (or a pixel having the maximum row position).

While the degradation estimation data are sequentially compared with the threshold value (e.g., the predetermined threshold value), if a value of the degradation estimation data is changed from less than or equal to the threshold value (e.g., the predetermined threshold value) to greater than the threshold value (e.g., the predetermined threshold value) (S240: YES), a position at which the value of the degradation estimation data is changed from less than or equal to the threshold value (e.g., the predetermined threshold value) to greater than the threshold value (e.g., the predetermined threshold value) may be set as a start point of a degraded region of the sensing channel (S245). Further, after the value of the degradation estimation data is changed to greater than the threshold value (e.g., the predetermined threshold value), if the value of the degradation estimation data is from greater than the threshold value (e.g., the predetermined threshold value) to less than or equal to the threshold value (e.g., the predetermined threshold value) (S250: YES), a position at which the value of the degradation estimation data is changed from greater than the threshold value (e.g., the predetermined threshold value) to less than or equal to the threshold value (e.g., the predetermined threshold value) may be set as an end point of the degraded region of the sensing channel (S255).

FIG. 5 represents the degradation estimation data 450 for the pixels corresponding to the N-th sensing channel. In the example of FIG. 5, the degradation estimation data 450 for the pixels corresponding to the N-th sensing channel may be sequentially compared with the threshold value (e.g., the predetermined threshold value) (S230). A first position P1 at which the value of the degradation estimation data 450 is changed from less than or equal to the threshold value (e.g., the predetermined threshold value) to greater than the threshold value (e.g., the predetermined threshold value) may be set as a first start point of a degraded region of the N-th sensing channel (S240: YES and S245), and a second position P2 at which the value of the degradation estimation data is changed from greater than the threshold value (e.g., the predetermined threshold value) to less than or equal to the threshold value (e.g., the predetermined threshold value) may be set as a first end point of the degraded region of the N-th sensing channel (S250: YES and S255). In a similar manner, until the degradation estimation data 450 for all pixels corresponding to the N-th sensing channel are compared with the threshold value (e.g., the predetermined threshold value) (S260: NO), start points P1, P3 and P5 and end points P2, P4 and P6 of the degraded region of the N-th sensing channel may be detected (S230, S240, S245, S250 and S255).

Once the degradation estimation data for all pixels corresponding to the sensing channel are compared with the threshold value (e.g., the predetermined threshold value) (S260: YES), a degradation baseline may be set for the sensing channel. In some example embodiments, the degradation baseline for the non-degraded region of the sensing channel may be set with the degradation sensing data for the pixels in the non-degraded region, and the degradation baseline for the degraded region of the sensing channel may be set by interpolating the degradation sensing data for at least two of the pixels in the non-degraded region adjacent to the degraded region (S270). For example, the degradation baseline for the degraded region of the sensing channel may be set by linearly interpolating the degradation sensing data for a first one of the pixels in the non-degraded region adjacent to a start point of the degraded region and the degradation sensing data for a second one of the pixels in the non-degraded region adjacent to an end point of the degraded region.

For example, as illustrated in FIG. 6, with respect to the N-th sensing channel, the degradation baseline 500 from a pixel at the first row to a pixel at the first start point P1 of the degraded region may be set with the degradation sensing data 350, and the degradation baseline 500 from the first start point P1 to the first end point P2 of the degraded region may be set by connecting with a straight line (or linearly interpolating) the degradation sensing data 350 for a pixel in the non-degraded region adjacent to the first start point P1 and the degradation sensing data 350 for a pixel in the non-degraded region adjacent to the first end point P2. In a similar manner, the degradation baseline 500 for the N-th sensing channel may be set by connecting the start points P3 and P5 (or the degradation sensing data 350 for the pixels adjacent to the start points P3 and P5) and the end points P4 and P6 (or the degradation sensing data 350 for the pixels adjacent to the end points P4 and P6).

Degrees of degradation of the pixels may be determined based on a difference between the degradation sensing data for the pixels and the degradation baseline (S280). In some example embodiments, the pixels in the non-degraded region may be determined to be not degraded, and the degrees of degradation of the pixels in the degraded region may be calculated by subtracting a value of the degradation baseline from a value of the degradation sensing data.

In the example of FIG. 6, because the degradation baseline for the non-degraded region of the N-th sensing channel is set with the degradation sensing data for the pixels in the non-degraded region, the degrees of degradation of the pixels in the non-degraded region may be 0 (or about 0), and thus the pixels in the non-degraded region may be determined to be not degraded. The degrees of degradation of the pixels PN in the degraded region may be calculated as a difference DIFF between a value SV of the degradation sensing data and a value BV of the degradation baseline 500. The degrees of degradation 600 of the pixels corresponding to the N-th sensing channel that are determined as described above are illustrated in FIG. 7.

The comparison operation for each sensing channel, the detection of the start and end points of the degraded region, the setting of the degradation baseline and the determination of the degrees of degradation (S230, S240, S245, S250, S255, S260, S270 and S280) may be repeated until theses operations are performed with respect to all sensing channels (S290).

As described above, in the method of sensing the degradation of the pixels according to example embodiments, the degradation baseline may be set for each sensing channel, and the degrees of deterioration of the pixels may be determined based on the difference between the degradation sensing data and the degradation baseline. Accordingly, the degrees of deterioration of the pixels may be accurately measured without performing the sensing offset compensation between the sensing ICs or the sensing channels.

Figure 8:
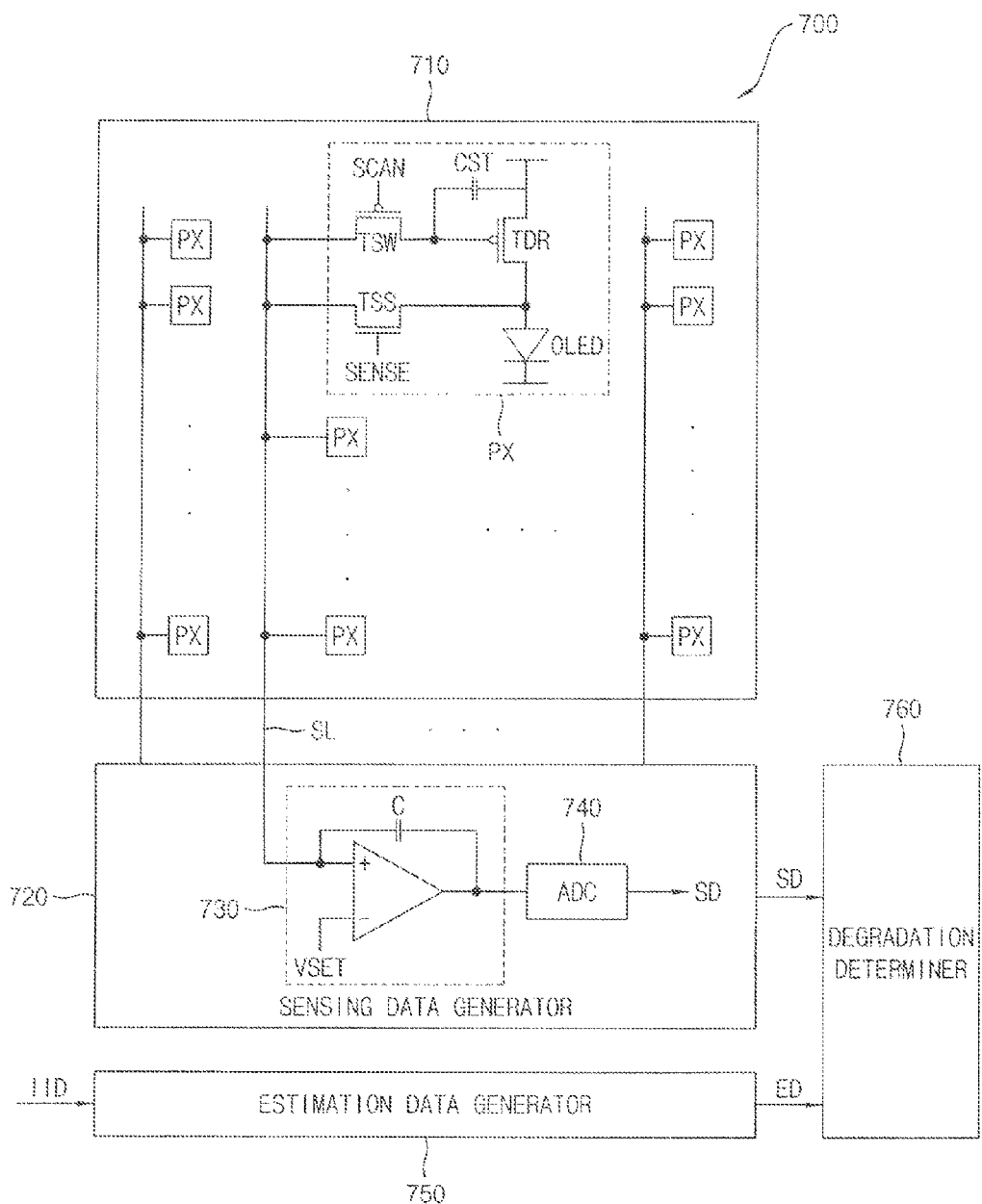
FIG. 8 is a diagram illustrating an OLED display device according to some example embodiments of the present invention.

FIG. 8 is a diagram illustrating an OLED display device according to example embodiments.

Referring to FIG. 8, an OLED display device 700 includes a display panel 710 including a plurality of pixels PX, a sensing data generator 720, an estimation data generator 750 and a degradation determiner 760.

The display panel 710 may be an OLED display panel, and may include the plurality of pixels PX arranged in a matrix form having a plurality of rows and a plurality of columns. In some example embodiments, each pixel PX may include a switching transistor TSW for transferring a data voltage in response to a scan signal SCAN, a storage capacitor CST for storing the data voltage transferred by the switching transistor TSW, a driving transistor TDR for generating a driving current based on the data voltage stored in the storage capacitor CST, an OLED for emitting light in response to the driving current generated by the driving transistor TDR, and a sensing transistor TSS for connecting a sensing line SL to the OLED (or the driving transistor TDR) in response to a sensing signal SENSE. Although FIG. 8 illustrates an example where the data line to which the data voltage is applied is used as the sensing line SL, in some example embodiments, the data line and the sensing line SL may be formed as separate lines. Further, although FIG. 8 illustrates an example where the sensing line SL is formed per each column of the pixels PX, in some example embodiments, two or more columns may share one sensing line SL.

The sensing data generator 720 may generate degradation sensing data SD by sensing degradation of the pixels PX. In some example embodiments, the sensing data generator 720 may apply a sensing voltage to the OLEDs included in the pixels PX through the sensing line SL, may measure sensing currents flowing through the OLEDs by the sensing voltage through the sensing line SL, and may generate the degradation sensing data SD based on the measured sensing currents.

To perform this operation, the sensing data generator 720 may include an integrator 730 configured to integrate the sensing currents flowing through the OLEDs of the pixels PX corresponding to each sensing channel (or the pixels PX connected to each sensing line SL), and an analog-to-digital converter (ADC) 740 configured to generate the degradation sensing data SD based on an output voltage of the integrator 730. For example, the integrator 730 may include an operational amplifier AMP having a non-inverting input connected to the sensing line SL and an inverting input for receiving a reference voltage VSET, and a capacitor C connected between the non-inverting input of the integrator 730 and an output of the integrator 730. In some example embodiments, the sensing data generator 720 may include one integrator 730 and one ADC 740 per each sensing channel or each sensing line SL. In other example embodiments, at least one of the integrator 730 or the ADC 740 may be shared by two or more sensing channels or two or more sensing lines SL. Further, according to example embodiments, the sensing data generator 720 may be implemented with a single sensing IC or two or more sensing ICs, or may be included in a data driver.

The estimation data generator 750 may generate degradation estimation data ED for the pixels PX based on input image data IID for the pixels PX. In some example embodiments, the estimation data generator 750 may accumulate the input image data IID for the pixels, and may generate the degradation estimation data ED based on the accumulated input image data IID. In some example embodiments, to retain the degradation estimation data ED even if the OLED display device 700 is powered off, the degradation estimation data ED may be stored in a nonvolatile memory. According to example embodiments, the estimation data generator 750 may be implemented within a timing controller or the data driver, or may be implemented as a separate component.

The degradation determiner 760 may receive the degradation sensing data SD from the sensing data generator 720, and may receive the degradation estimation data ED from the estimation data generator 750. The degradation determiner 760 may set a degradation baseline for each sensing channel based on the degradation estimation data ED. In some example embodiments, the degradation determiner 760 may divide the pixels PX corresponding to each sensing channel into pixels in a non-degraded region and pixels in a degraded region based on the degradation estimation data ED for the pixels corresponding to the sensing channel. For example, the degradation determiner 760 may determine the pixels PX having the degradation estimation data ED less than or equal to a threshold value (e.g., the predetermined threshold value) as the pixels PX in the non-degraded region, and may determine the pixels PX having the degradation estimation data ED greater than the threshold value (e.g., the predetermined threshold value) as the pixels PX in the degraded region.

The degradation determiner 760 may set the degradation baseline for the non-degraded region of the sensing channel based on the degradation sensing data SD for the pixels PX in the non-degraded region, and may set the degradation baseline for the degraded region of the sensing channel by interpolating the degradation sensing data SD for at least two of the pixels PX in the non-degraded region adjacent to the degraded region. For example, the degradation determiner 760 may set the degradation baseline for the degraded region of the sensing channel by linearly interpolating the degradation sensing data SD for a first one of the pixels PX in the non-degraded region adjacent to a start point of the degraded region and the degradation sensing data SD for a second one of the pixels in the non-degraded region adjacent to an end point of the degraded region.

In other example embodiments, the degradation determiner 760 may sequentially compare the degradation estimation data ED for the pixels PX corresponding to each sensing channel with the threshold value (e.g., the predetermined threshold value), may set a position at which a value of the degradation estimation data ED is changed from less than or equal to the threshold value (e.g., the predetermined threshold value) to greater than the threshold value (e.g., the predetermined threshold value) as the start point of the degraded region of the sensing channel, may set a position at which the value of the degradation estimation data ED is changed from greater than the threshold value (e.g., the predetermined threshold value) to less than or equal to the threshold value (e.g., the predetermined threshold value) as the end point of the degraded region of the sensing channel, and may set the degradation baseline for the degraded region by interpolating the degradation sensing data for at least two of the pixels in the non-degraded region adjacent to the degraded region.

The degradation determiner 760 may determine degrees of degradation of the pixels PX based on a difference between the degradation sensing data SD and the degradation baseline. As described above, because the degradation baseline is set for each sensing channel, and the degrees of degradation of the pixels PX are determined based on the difference between the degradation sensing data SD and the degradation baseline, the degrees of degradation of the pixels PX may be accurately measured without performing offset compensation between sensing channels or sensing ICs. According to example embodiments, the degradation determiner 760 may be implemented within at least one sensing IC, within the timing controller, or within the data driver.

The degradation of the pixels PX may be compensated based on the degrees of degradation of the pixels PX determined by the degradation determiner 760. In some example embodiments, the degrees of degradation of the pixels PX determined by the degradation determiner 760 may be provided to a data converter, and the data converter may convert the input image data IID into compensated image data based on the determined degrees of degradation to compensate the degradation of the pixels PX. The data converter may be implemented within the timing controller, or may be implemented as a separate component. In other example embodiments, the degrees of degradation of the pixels PX determined by the degradation determiner 760 may be provided to the data driver, and the data driver may adjust the data voltage (or a gamma voltage) applied to the pixels PX based on the determined degrees of degradation to compensate the degradation of the pixels PX. Accordingly, the degradation of the pixels PX may be compensated, and the pixels PX included in the OLED display device may have uniform luminance.

Figure 9:
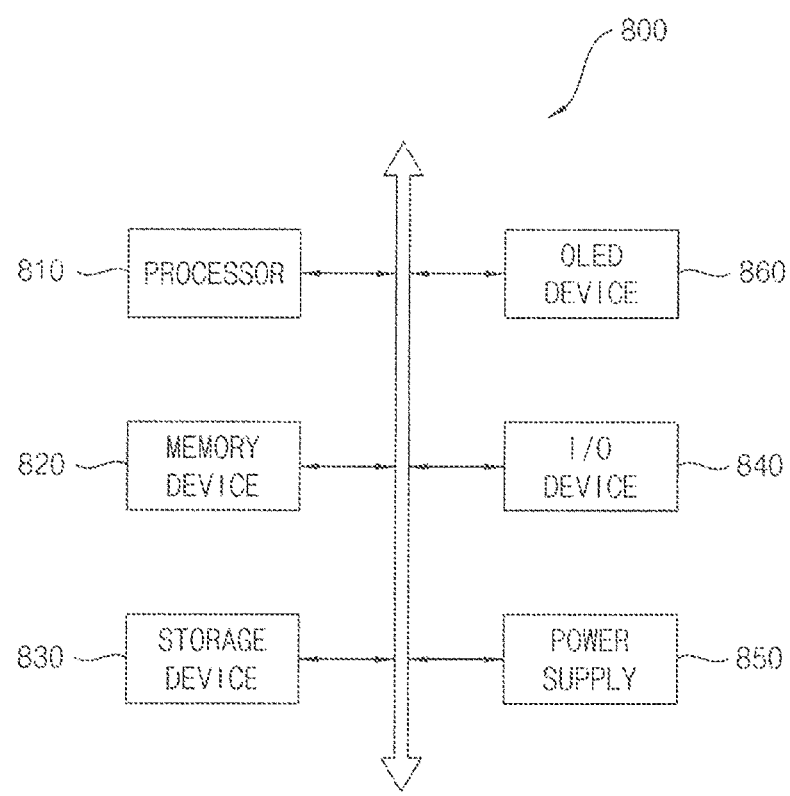
FIG. 9 is a block diagram illustrating an electronic device including an OLED display device according to some example embodiments of the present invention.

FIG. 9 is a block diagram illustrating an electronic device including an OLED display device according to example embodiments.

Referring to FIG. 9, an electronic device 800 may include a processor 810, a memory device 820, a storage device 830, an input/output (I/O) device 840, a power supply 850, and an OLED display device 860. The electronic device 800 may further include a plurality of ports for communicating a video card, a sound card, a memory card, a universal serial bus (USB) device, other electric devices, etc.

The processor 810 may perform various computing functions. The processor 810 may be a micro processor, a central processing unit (CPU), an application processor (AP), etc. The processor 810 may be coupled to other components via an address bus, a control bus, a data bus, etc. Further, in some example embodiments, the processor 810 may be further coupled to an extended bus such as a peripheral component interconnection (PCI) bus.

The memory device 820 may store data for operations of the electronic device 800. For example, the memory device 820 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc, and/or at least one volatile memory device such as a dynamic random access memory (DRAM) device, a static random access memory (SRAM) device, a mobile dynamic random access memory (mobile DRAM) device, etc.

The storage device 830 may be a solid state drive device, a hard disk drive device, a CD-ROM device, etc. The I/O device 840 may be an input device such as a keyboard, a keypad, a mouse, a touch screen, etc, and an output device such as a printer, a speaker, etc. The power supply 850 may supply power for operations of the electronic device 800.

The OLED display device 860 may set a degradation baseline for each sensing channel, and may determine degrees of degradation of pixels based on a difference between degradation sensing data and the degradation baseline. Accordingly, even if sensing offset compensation between sensing ICs or sensing channels is not performed, the OLED display device 860 may accurately measure the degrees of degradation of the pixels, and may accurately compensate the degradation of the pixels based on the accurately measured degrees of degradation.

The present inventive concept may be applied to any electronic device 800 including the OLED display device 860. For example, the present inventive concept may be applied to a cellular phone, a smart phone, a tablet computer, a wearable device, a personal digital assistant (PDA), a portable multimedia player (PMP), a digital camera, a music player, a portable game console, a navigation system, a digital television, a 3D television, a personal computer (PC), a home appliance, a laptop computer, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and aspects of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims, and their equivalents.

What is claimed is:

1. A method of sensing degradation of pixels in an organic light emitting diode (OLED) display device, the method comprising:

generating degradation sensing data for the pixels by sensing the degradation of the pixels;

generating degradation estimation data for the pixels based on input image data for the pixels;

setting a degradation baseline for each sensing channel based on the degradation estimation data; and determining degrees of degradation of the pixels based on a difference between the degradation sensing data and the degradation baseline.

2. The method of claim 1, wherein setting the degradation baseline for each sensing channel comprises:

dividing the pixels corresponding to the sensing channel into pixels in a non-degraded region and pixels in a degraded region based on the degradation estimation data for the pixels corresponding to the sensing channel;

setting the degradation baseline for the non-degraded region of the sensing channel based on the degradation sensing data for the pixels in the non-degraded region; and setting the degradation baseline for the degraded region of the sensing channel by interpolating the degradation sensing data for at least two of the pixels in the non-degraded region adjacent to the degraded region.

3. The method of claim 2, wherein dividing the pixels corresponding to the sensing channel into the pixels in the non-degraded region and the pixels in the degraded region comprises:
identifying a first group from among the pixels having the degradation estimation data less than or equal to a threshold value as being in the non-degraded region; and
identifying a second group from among the pixels having the degradation estimation data greater than the threshold value as being in the degraded region.

4. The method of claim 2, wherein setting the degradation baseline for the degraded region of the sensing channel comprises:
setting the degradation baseline for the degraded region of the sensing channel by linearly interpolating the degradation sensing data for a first one of the pixels in the non-degraded region adjacent to a start point of the degraded region and the degradation sensing data for a second one of the pixels in the non-degraded region adjacent to an end point of the degraded region.

5. The method of claim 1, wherein generating the degradation sensing data for the pixels comprises:
measuring sensing currents flowing through OLEDs in the pixels; and
generating the degradation sensing data for the pixels based on the sensing currents.

6. The method of claim 1, wherein generating the degradation estimation data for the pixels comprises:
accumulating the input image data for the pixels; and
generating the degradation estimation data for the pixels based on the accumulated input image data.

7. The method of claim 1, further comprising:
compensating the degradation of the pixels based on the degrees of degradation of the pixels.

8. A method of sensing degradation of pixels in an organic light emitting diode (OLED) display device, the method comprising:
generating degradation sensing data for the pixels by sensing the degradation of the pixels;
generating degradation estimation data for the pixels based on input image data for the pixels;
sequentially comparing the degradation estimation data for the pixels corresponding to each sensing channel with a threshold value;
setting a position at which a value of the degradation estimation data is changed from less than or equal to the threshold value to greater than the threshold value as a start point of a degraded region of the sensing channel;
setting a position at which the value of the degradation estimation data is changed from greater than the threshold value to less than or equal to the threshold value as an end point of the degraded region of the sensing channel;
setting a degradation baseline for the degraded region by interpolating the degradation sensing data for at least two of the pixels in a non-degraded region adjacent to the degraded region; and
determining degrees of degradation of the pixels in the degraded region based on a difference between the degradation sensing data for the pixels in the degraded region and the degradation baseline for the degraded region.

9. The method of claim 8, wherein setting the degradation baseline for the degraded region comprises:
setting the degradation baseline for the degraded region by linearly interpolating the degradation sensing data for a first one of the pixels in the non-degraded region adjacent to the start point of the degraded region and the degradation sensing data for a second one of the pixels in the non-degraded region adjacent to the end point of the degraded region.

10. The method of claim 8, wherein the pixels in the non-degraded region are determined to be not degraded.

11. An organic light emitting diode (OLED) display device, comprising:
a plurality of pixels comprising a plurality of OLEDs, respectively;
a sensing data generator configured to generate degradation sensing data for the pixels by sensing the degradation of the pixels;
an estimation data generator configured to generate degradation estimation data for the pixels based on input image data for the pixels; and
a degradation determiner configured to receive the degradation sensing data from the sensing data generator, to receive the degradation estimation data from the estimation data generator, to set a degradation baseline for each sensing channel based on the degradation estimation data, and to determine degrees of degradation of the pixels based on a difference between the degradation sensing data and the degradation baseline.

12. The OLED display device of claim 11, wherein the degradation determiner is configured to divide the pixels corresponding to the sensing channel into pixels in a non-degraded region and pixels in a degraded region based on the degradation estimation data for the pixels corresponding to the sensing channel, set the degradation baseline for the non-degraded region of the sensing channel based on the degradation sensing data for the pixels in the non-degraded region, and set the degradation baseline for the degraded region of the sensing channel by interpolating the degradation sensing data for at least two of the pixels in the non-degraded region adjacent to the degraded region.

13. The OLED display device of claim 12, wherein the degradation determiner is configured to identify a first group from among the pixels having the degradation estimation data less than or equal to a threshold value as being in the non-degraded region, and to identify a second group from among the pixels having the degradation estimation data greater than the threshold value as being in the degraded region.

14. The OLED display device of claim 12, wherein the degradation determiner is configured to set the degradation baseline for the degraded region of the sensing channel by linearly interpolating the degradation sensing data for a first one of the pixels in the non-degraded region adjacent to a start point of the degraded region and the degradation sensing data for a second one of the pixels in the non-degraded region adjacent to an end point of the degraded region.

15. The OLED display device of claim 11, wherein the degradation determiner is configured to sequentially compare the degradation estimation data for the pixels corresponding to each sensing channel with a threshold value, set a position at which a value of the degradation estimation data is changed from less than or equal to the threshold value to greater than the threshold value as a start point of a degraded region of the sensing channel, set a position at which the value of the degradation estimation data is changed from greater than the threshold value to less than or equal to the threshold value as an end point of the degraded region of the sensing channel, set a degradation baseline for the degraded region by interpolating the degradation sensing data for at least two of the pixels in a non-degraded region adjacent to the degraded region, and determine the degrees of degradation of the pixels in the degraded region based on a difference between the degradation sensing data for the pixels in the degraded region and the degradation baseline for the degraded region.

16. The OLED display device of claim 11, wherein the sensing data generator is configured to measure sensing currents flowing through the OLEDs included in the pixels, and generate the degradation sensing data for the pixels based on the sensing currents.

17. The OLED display device of claim 16, wherein the sensing data generator comprises:
an integrator configured to integrate the sensing currents flowing through the OLEDs of the pixels corresponding to the sensing channel; and
an analog-to-digital converter configured to generate the degradation sensing data based on an output voltage of the integrator.

18. The OLED display device of claim 11, wherein the estimation data generator is configured to accumulate the input image data for the pixels, and to generate the degradation estimation data for the pixels based on the accumulated input image data.

19. The OLED display device of claim 11, further comprising:
a data converter configured to convert the input image data into compensated image data to compensate the degradation of the pixels based on the degrees of degradation of the pixels.

20. The OLED display device of claim 11, further comprising:
a data driver configured to adjust data voltages applied to the pixels to compensate the degradation of the pixels based on the degrees of degradation of the pixels.

* * * * *